(12) United States Patent
Wang

(10) Patent No.: US 10,217,779 B2
(45) Date of Patent: Feb. 26, 2019

(54) SYSTEMS AND METHODS FOR IMPROVING A SPECTRAL RESPONSE CURVE OF A PHOTO SENSOR

(71) Applicant: Desheng Wang, Diamond Bar, CA (US)

(72) Inventor: Desheng Wang, Diamond Bar, CA (US)

(*) Notice: Subject to any disclaimer, the term of this patent is extended or adjusted under 35 U.S.C. 154(b) by 160 days.

(21) Appl. No.: 15/612,612

(22) Filed: Jun. 2, 2017

(65) Prior Publication Data

US 2017/0356804 A1    Dec. 14, 2017

Related U.S. Application Data

(60) Provisional application No. 62/347,414, filed on Jun. 8, 2016.

(51) Int. Cl.
*G01J 3/51* (2006.01)
*H01L 27/144* (2006.01)
*G01J 3/02* (2006.01)
*G01J 3/12* (2006.01)

(52) U.S. Cl.
CPC ........ *H01L 27/1446* (2013.01); *G01J 3/0259* (2013.01); *G01J 3/513* (2013.01); *G01J 2003/1282* (2013.01)

(58) Field of Classification Search
CPC ....... G01J 3/51; G01J 3/513; H01L 27/14621; H01L 31/02162
USPC ............................................. 250/214.1, 226
See application file for complete search history.

(56) References Cited

U.S. PATENT DOCUMENTS

2015/0241336 A1* 8/2015 Krief .................. A01J 5/0135
                                                              356/409
2018/0358399 A1* 12/2018 Huang .............. H01L 27/14652

* cited by examiner

*Primary Examiner* — Kevin K Pyo
(74) *Attorney, Agent, or Firm* — Innovation Capital Law Group, LLP; Vic Lin

(57) ABSTRACT

A cost effective multicolor sensor and related software achieves a spectral response that closely approximates an ideal photo response to measure optical measurement, for example photosynthetic photo flux density (PPFD). The spectra error of the sensor is smaller than that of the best commercially available sensor at a significantly reduced cost. The sensor may include an 8×2 array of filtered photodiodes and spectral photo sensors that are linearly combined with the appropriate mathematically determined coefficients to create a corrected spectral response curve that has a spectral error much smaller than the best commercial available sensors made by physical coating methods for the entire desired range.

16 Claims, 4 Drawing Sheets

SYSTEMS AND METHODS FOR IMPROVING A SPECTRAL RESPONSE CURVE OF A PHOTO SENSOR

BACKGROUND OF THE INVENTION

1. Field of the Invention

One or more embodiments of the invention relates generally to photo sensors. More particularly, the invention relates to systems and methods for improving the spectral response curve of a photo sensor or a photo sensor array.

2. Description of Prior Art and Related Information

The following background information may present examples of specific aspects of the prior art (e.g., without limitation, approaches, facts, or common wisdom) that, while expected to be helpful to further educate the reader as to additional aspects of the prior art, is not to be construed as limiting the present invention, or any embodiments thereof, to anything stated or implied therein or inferred thereupon.

Photosynthetically Active Radiation (PAR) is an often used to define the type of light needed to support photosynthesis in plant life. Through photosynthesis, plants convert light energy into chemical energy, which is the food they use to grow and thrive.

Some light is visible to the human eye and some is not. Light of different wavelengths make up the electromagnetic radiation spectrum. This spectrum includes X-rays, radio waves and infrared light (none of which are visible to the human eye) and light that can be seen, such as sunlight, and light from a red or blue LED, for example.

Interestingly, plants use roughly the same part of the spectrum that's visible to the human eye. Photons at shorter wavelengths tend to be so energetic that they can be damaging to cells and tissues, but are mostly filtered out by the ozone layer in the stratosphere. Photons at longer wavelengths do not carry enough energy to allow photosynthesis to take place.

Photosynthetic photon flux density (PPFD) is the amount of the PAR that falls on a given surface each second. PPFD is a spot measurement of a specific location in, for example, a plant canopy, and it is measured in micromoles per square meter per second.

Quantum sensors are used to measure the PPFD of the PAR. A simple integral relationship exists between the number of molecules photochemically changed and the number of photons absorbed within a particular waveband, regardless of photon energy. An ideal quantum sensor should have an equal response to all photons within the 400-700 nm waveband. A typical quantum sensor consists of ultraviolet and infrared cut-off filters to prevent undesired ultraviolet and infrared light outside the 400-700 nm range. These cut-off filters are relatively inexpensive. However, there are no photo sensors on the market which have an equal response to all photons within the 400-700 nm range, unless expensive filter arrays are used.

Several types of photodiodes are suitable for PPFD measurement. These include silicon, selenium, cadmium sulfide, lead sulfide, lead selenide and gallium arsenide phosphide photodiodes. Of these, blue enhanced filtered silicon photodiodes are commercially available that have a spectral response that closely approximates the ideal photon response. However, these sensors carry a significant expense. Unfiltered gallium arsenide phosphide photodiodes are an inexpensive alternative, however the spectral error in these photodiodes raise potential problems.

In view of the foregoing, there is a need for a cost effective photocell-filter combination to minimize spectral error in optical measurements.

SUMMARY OF THE INVENTION

Embodiments of the present invention provide a photo sensor array comprising a plurality of photodiodes; a first portion of the plurality of photodiodes having a red filter; a second portion of the plurality of photodiodes having a green filter; a third portion of the plurality of photodiodes having a blue filter; and a fourth portion of the plurality of photodiodes having no filter.

Embodiments of the present invention further provide a tuned photo sensor chip comprising a plurality of photodiodes; a first portion of the plurality of photodiodes having a red filter; a second portion of the plurality of photodiodes having a green filter; a third portion of the plurality of photodiodes having a blue filter; and a fourth portion of the plurality of photodiodes having no filter, wherein the final output is calculated based on the predetermined function form of outputs of photodiodes and the predetermined mathematical coefficients, the mathematical coefficients selected to provide a spectral response curve of the photo sensor array that approximates an ideal spectral response curve.

In some embodiments an output from the photo sensor chip is substantially constant throughout a wavelength range from 400 nm to 700 nm. In some embodiments an error between the output from the photo sensor chip and the ideal spectral response is no more than about 18 percent. In some embodiments, an error between the output from the photo sensor chip and the ideal spectral response is no more than about 5 percent between about 450 nm to 700 nm.

Embodiments of the present invention also provide a method for producing an output from a photo sensor array that is substantially constant throughout a predetermined wavelength range comprising combining a plurality of photodiodes into a chip, the plurality of photodiodes including a first portion having a red filter, a second portion having a green filter, a third portion having a blue filter and a fourth portion having no filter; and adjusting an output of each of the plurality of photodiodes a mathematical coefficient, the mathematical coefficients selected to provide a spectral response curve of the photo sensor that approximates an ideal spectral response curve.

These and other features, aspects and advantages of the present invention will become better understood with reference to the following drawings, description and claims.

BRIEF DESCRIPTION OF THE DRAWINGS

Some embodiments of the present invention are illustrated as an example and are not limited by the figures of the accompanying drawings, in which like references may indicate similar elements.

Figure 1:
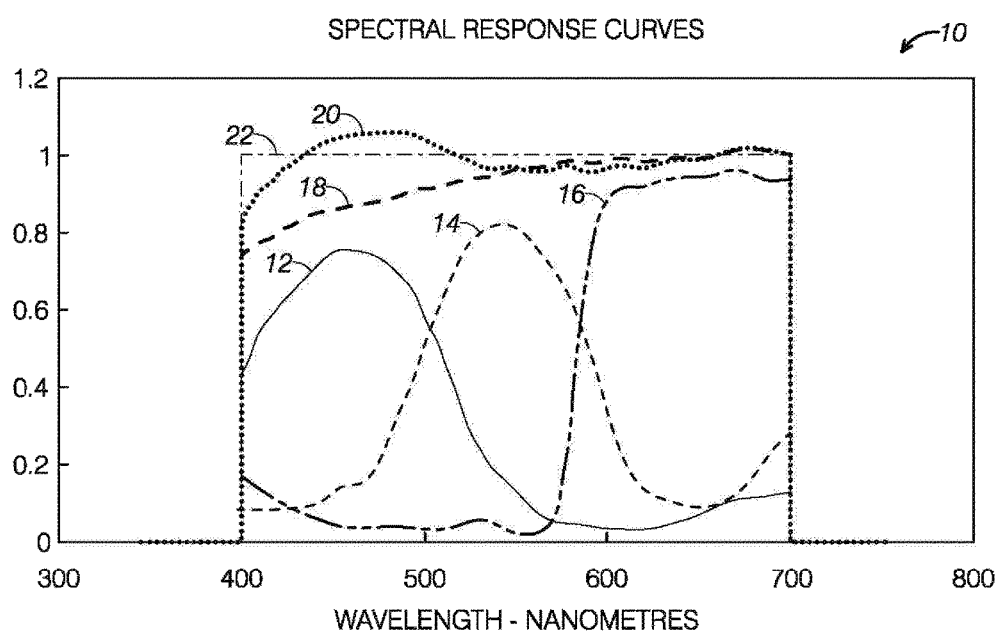
FIG. 1 illustrates spectral response curves of multicolor sensors compared against an ideal response curve and a response curve obtained according to methods of the present invention.

Unless otherwise indicated illustrations in the figures are not necessarily drawn to scale.

The invention and its various embodiments can now be better understood by turning to the following detailed description wherein illustrated embodiments are described. It is to be expressly understood that the illustrated embodiments are set forth as examples and not by way of limitations on the invention as ultimately defined in the claims.

DETAILED DESCRIPTION OF THE PREFERRED EMBODIMENTS AND BEST MODE OF INVENTION

The terminology used herein is for the purpose of describing particular embodiments only and is not intended to be limiting of the invention. As used herein, the term "and/or" includes any and all combinations of one or more of the associated listed items. As used herein, the singular forms "a," "an," and "the" are intended to include the plural forms as well as the singular forms, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one having ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

In describing the invention, it will be understood that a number of techniques and steps are disclosed. Each of these has individual benefit and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

In the following description, for purposes of explanation, numerous specific details are set forth in order to provide a thorough understanding of the present invention. It will be evident, however, to one skilled in the art that the present invention may be practiced without these specific details.

The present disclosure is to be considered as an exemplification of the invention, and is not intended to limit the invention to the specific embodiments illustrated by the figures or description below.

Devices or system modules that are in at least general communication with each other need not be in continuous communication with each other, unless expressly specified otherwise. In addition, devices or system modules that are in at least general communication with each other may communicate directly or indirectly through one or more intermediaries.

A description of an embodiment with several components in communication with each other does not imply that all such components are required. On the contrary, a variety of optional components are described to illustrate the wide variety of possible embodiments of the present invention.

As is well known to those skilled in the art, many careful considerations and compromises typically must be made when designing for the optimal configuration of a commercial implementation of any system, and in particular, the embodiments of the present invention. A commercial implementation in accordance with the spirit and teachings of the present invention may be configured according to the needs of the particular application, whereby any aspect(s), feature (s), function(s), result(s), component(s), approach(es), or step(s) of the teachings related to any described embodiment of the present invention may be suitably omitted, included, adapted, mixed and matched, or improved and/or optimized by those skilled in the art, using their average skills and known techniques, to achieve the desired implementation that addresses the needs of the particular application.

Broadly, embodiments of the present invention provide a cost effective multicolor sensor and related software to achieve a spectral response that closely approximates an ideal photo response to measure photosynthetic photo flux density (PPFD), for example. The spectra error of the sensor is smaller than that of the best commercially available sensor at a significantly reduced cost. In an embodiment, the sensor includes an 8×2 array of filtered photodiodes that are linearly combined with the appropriate mathematically determined coefficients to create a corrected spectral response curve that has a spectral error that is within about five percent of an ideal curve throughout the entire range of 400 nm-700 nm, except for a portion at 400 nm.

During the design of a photo sensor, it was found that, in order to minimize spectra errors and achieve a spectral response that closely approximates the desired photon response, photocell-filter combinations have to be used. These photocell-filters are difficult to manufacture and require sophisticated manufacture technologies, equipment and control, which results in high costs. Embodiments of the present invention eliminates these manufacturing processes by using inexpensive, commercially available multicolor sensors to achieve the same goal.

Figure 3:
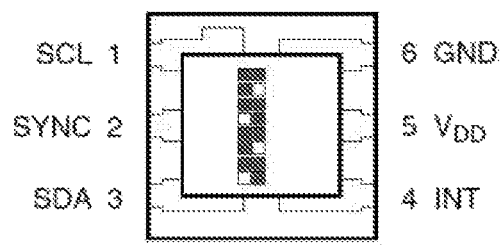
FIG. 3 illustrates a representative 8×2 array of filtered photodiodes usable in embodiments of the present invention.

In some embodiments, an 8×2 array of filtered photodiodes as shown in FIG. 3 may be used. SCL, SYNC, SDA, IN, VDD, GND are the serial clock input terminal-clock signal for I2C serial data, synchronous input, serial data I/O terminal-serial data I/O for I2C, level interrupt-open drain, supply voltage and power supply ground respectively.

Figure 4:
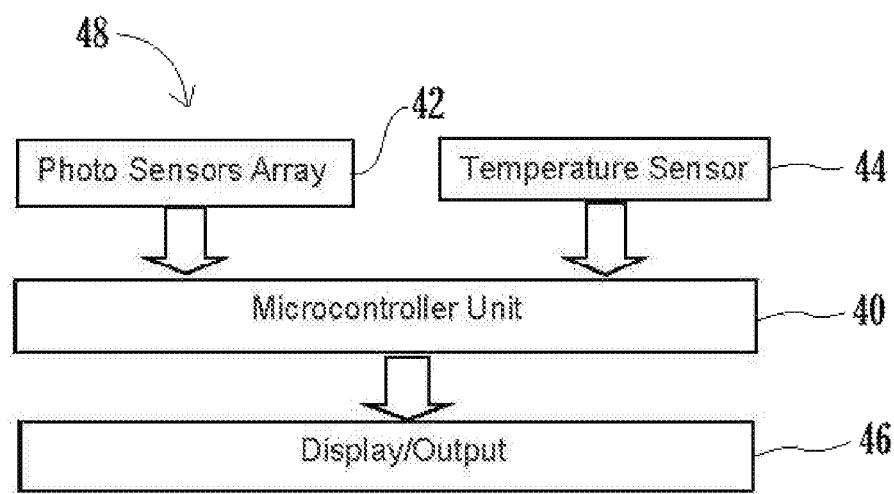
FIG. 4 illustrates a schematic representation of a measurement device usable in embodiments of the present invention.
Figure 5:
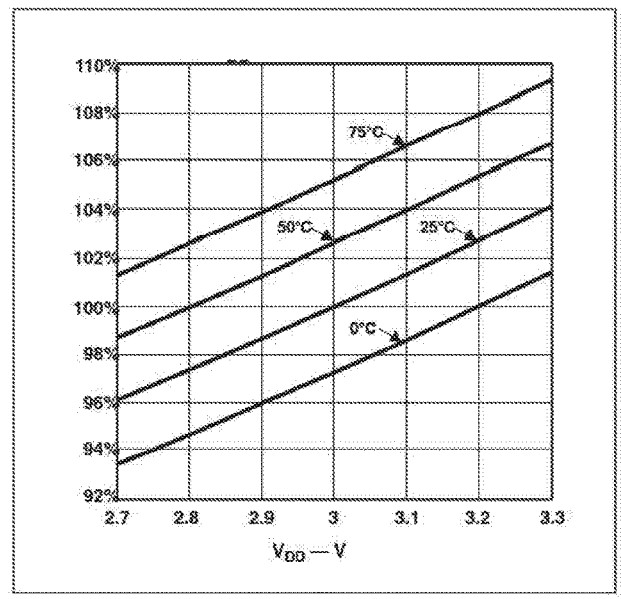
FIG. 5 illustrates graphs showing normalized VDD and temperature.

A typical of array of photo 8×2 photo sensors and a measurement device 48 are shown in FIGS. 3 and 4. The photo sensor array 42 collects digital measurements and sends to the microcontroller unit 40 for processing. The appropriate coefficients are stored in the microcontroller unit 40 which uses the coefficients and digital measurements from the photo array 42 to calculate the final results, the final results are sent to an output 46 for display. A photo sensor array may expose to high intensity light, a temperature compensation sensor may improve the accuracy of the measurements. A typical VDD dependence of the temperature is given by FIG. 5. A temperature sensor 44 is used in the system shown in FIG. 4. The temperature measurement is used for compensation.

The spectral response curves shown in FIG. 1 are used to determine the coefficients. A mathematical algorithm has to be established first. The algorithm is chosen so that it can give a fitting which gives a smallest deviation to the ideal curve.

A linear form is the simplest mathematical function for the application. The coefficients can be obtained by try-and-error or any fitting algorithm.

The filters can include, for example, four each of a red filter, a green filter, a blue filter and no filter (clear). FIG. 1 shows the response curve of each sensor. Line 12 shows the response curve of the photodiode with the blue filter, line 14 shows the response curve of the photodiode with the green filter, line 16 shows the response curve of the photodiode with the red filter, and line 18 shows the response curve of the photodiode with no filter. Line 22 shows the ideal response curve.

In some embodiments, all of the 8×2 array of filtered photodiodes can be integrated into a single chip that may have a size of, for example, about 2 mm by 2 mm. In comparison with the ideal spectral response, line 22, the spectral error of any sensor alone is too large.

Line 20 of FIG. 1 shows a correct spectral response curve achieved by methods of the present invention. The spectral error is within about five percent in comparison to the ideal spectral response, except in the 400 nm range, where the spectral error is about 15 percent. The corrected spectral response curve is a linear combination of the blue filtered photodiode, the green filtered photodiode, the red filtered photodiode and the photodiode lacking a filter. The coefficients of this linear combination are determined mathematically to create a spectral response curve that approaches the ideal spectral response curve.

Figure 2:
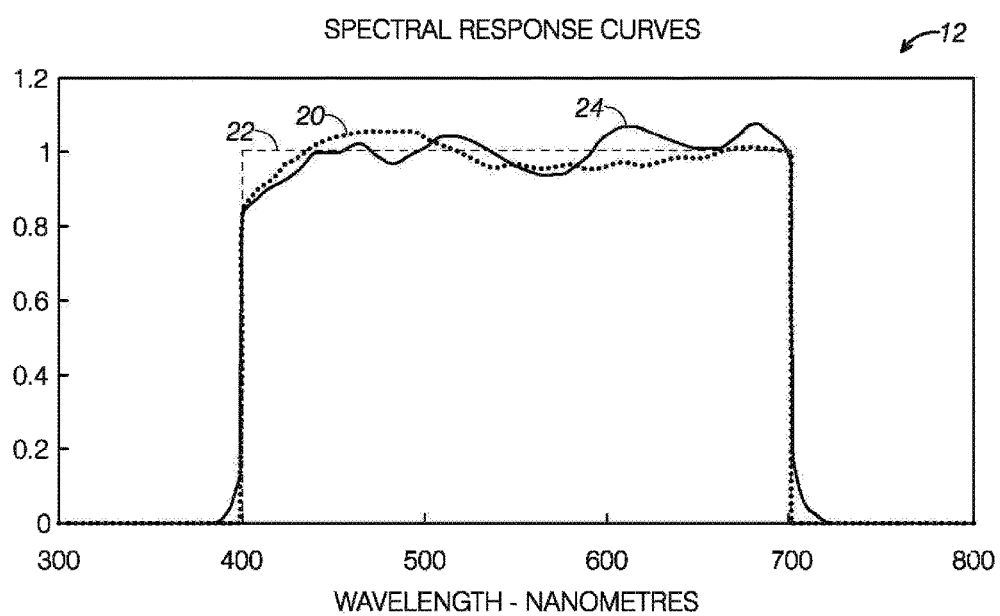
FIG. 2 illustrates spectral response curves comparing a commercially available, relatively expensive sensor, the ideal response curve, and the response curve obtained according to methods of the present invention.

FIG. 2 shows spectral response curves of the corrected spectral response curve, line 20, obtained by methods and apparatus of the present invention, the ideal spectral response curve, line 22, and a quantum sensor spectral response curve, line 24, obtained with an expensive, commercially available quantum sensor. Compared to the ideal spectral response curve, line 22, the quantum sensor spectral response curve, line 24, has spectral error that is about 10 percent and has a spectral error of about 17 percent at the 400 nm range.

As can be seen, the corrected spectral response curve obtained by apparatus and methods of the present invention has a better response than the commercially available quantum sensor throughout almost the entire 400 nm –700 nm range. Moreover, the corrected spectral response curve achieved by the sensor array of the present invention has a lower cost due to the elimination of expensive special filters.

Fitting requires a parametric model that relates the response data to the predictor data with one or more coefficients. The result of the fitting process is an estimate of the model coefficients. For example, curve 12, 14, 16, 18 in FIG. 1 are used as basic functions to fit the desired ideal spectral response curve 22 in the present invention. Generally, the desired spectral response curve is a function of wavelength and is a constant in the present example. The fitted spectral response curve can be written as a known function of curve 12, 14, 16 and 18, for example, a polynomial expansion of curves 12, 14, 16 and 18. The higher order of polynomial, the better the accuracy. However, the microprocessor 40 used in FIG. 4 may not support sophisticated calculations, a simpler fitting function form such as a linear form may have to be used. There are many methods such as linear or nonlinear least square fitting or commercially available software which might use to estimate the coefficients. Once obtained, the appropriate coefficients are programmed into the microprocessor 40 in FIG. 4, and may be used to perform light measurements. In some embodiments, the sensor array may be used as a quantum sensor for measurement of PPFD of PAR.

While the above describes an 8×2 array of photodiodes, the sensor of the present invention may be formed from various sized sensor arrays. Moreover, while the above describes an equal number of red, green and blue filtered photodiodes, the number of each color filter photodiodes may vary.

Figure 6:
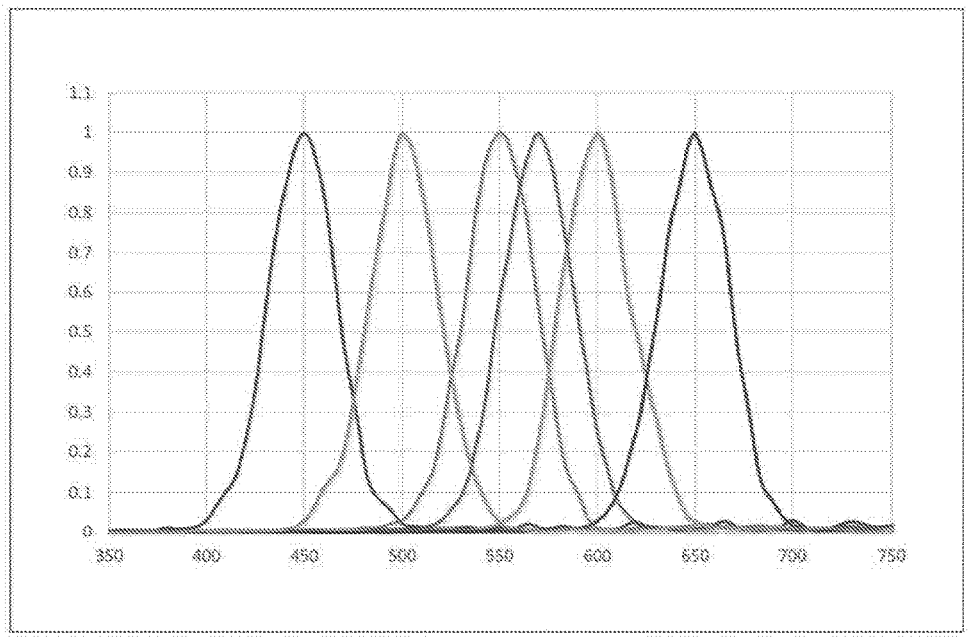
FIG. 6 illustrates spectral response curves as function of wavelength in nanometer.
Figure 7:
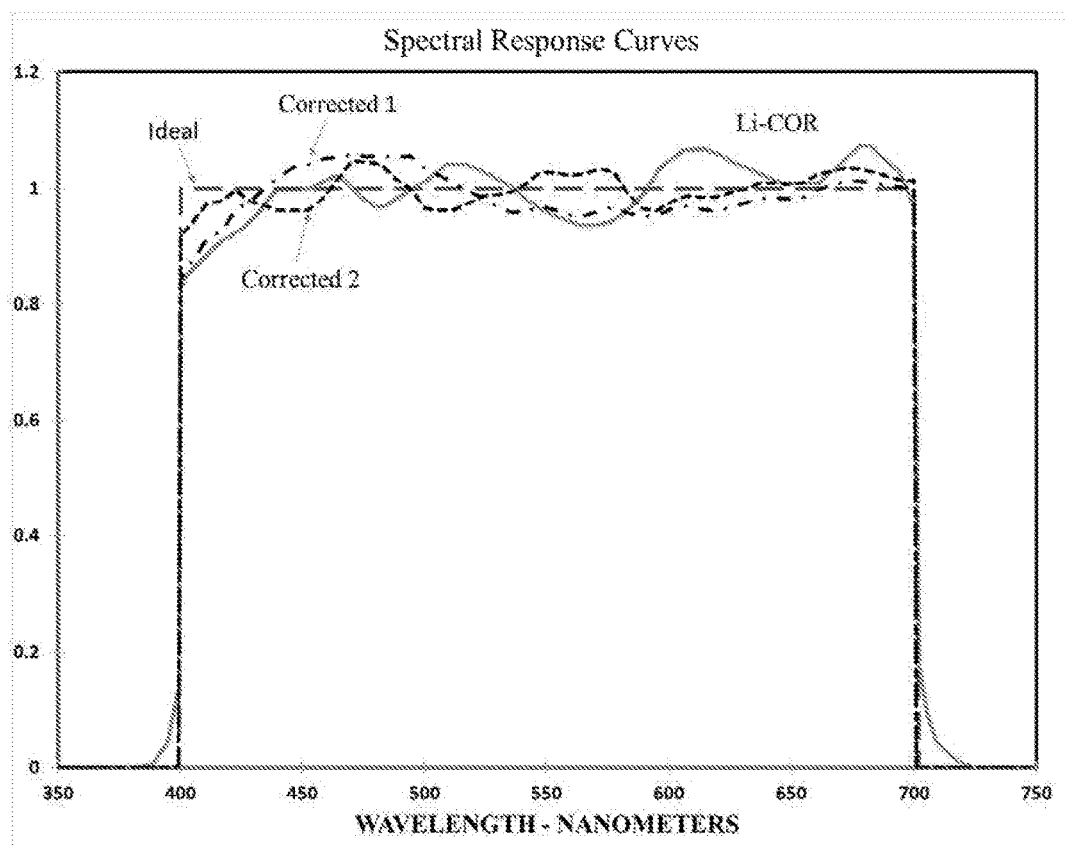
FIG. 7 illustrates spectral response curves comparing a commercially available, relatively expensive sensor, the ideal response curve, and the response curves obtained according to methods of the present invention.

Spectral sensors are another group of sensors have array of narrow wavelength. The typical spectral responses of these sensors are shown in FIG. 6 which are ideal for corrections for the local spectral response curves using the both 8×2 array of photodiodes and an array of spectral sensors. The spectral response curve can be further improved, for example, the curve Corrected 2 shown in FIG. 7 is significantly better than the best commercially available Li-COR one. Even in the worst case, at 400 nm range, the Li-COR one gives about 16% inaccuracy, the inaccuracy is about 8% and 14% for array of sensors with and without using the array of spectral sensors. The overall spectral response curve is more closely to the ideal one using the spectral sensor array.

The cut off filters were used to limit the spectral range from 400 to 700 nm range in the present invention. Using different cut off filters can achieve different desired spectral range. This technique is widely used in the optics.

It should be noted that, while the above discussion relates to photo sensors for PPFD measurements, the present invention is not limited to such quantum sensors. The photo sensors of the present invention may be applied to various applications where light measurements are desired.

All the features disclosed in this specification, including any accompanying abstract and drawings, may be replaced by alternative features serving the same, equivalent or similar purpose, unless expressly stated otherwise. Thus, unless expressly stated otherwise, each feature disclosed is one example only of a generic series of equivalent or similar features.

Claim elements and steps herein may have been numbered and/or lettered solely as an aid in readability and understanding. Any such numbering and lettering in itself is not intended to and should not be taken to indicate the ordering of elements and/or steps in the claims.

Many alterations and modifications may be made by those having ordinary skill in the art without departing from the spirit and scope of the invention. Therefore, it must be understood that the illustrated embodiments have been set forth only for the purposes of examples and that they should not be taken as limiting the invention as defined by the following claims. For example, notwithstanding the fact that the elements of a claim are set forth below in a certain combination, it must be expressly understood that the invention includes other combinations of fewer, more or different ones of the disclosed elements.

The words used in this specification to describe the invention and its various embodiments are to be understood not only in the sense of their commonly defined meanings, but to include by special definition in this specification the generic structure, material or acts of which they represent a single species.

The definitions of the words or elements of the following claims are, therefore, defined in this specification to not only include the combination of elements which are literally set forth. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a sub combination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what incorporates the essential idea of the invention.

What is claimed is:

1. A photo sensor array comprising:
   a plurality of photodiodes;
   a first portion of the plurality of photodiodes having a red filter;
   a second portion of the plurality of photodiodes having a green filter;
   a third portion of the plurality of photodiodes having a blue filter;
   a fourth portion of the plurality of photodiodes having no filter
   a fifth portion of the plurality of photodiodes having spectral photo sensors; and
   a sixth portion of the plurality of photodiodes having temperature compensation sensors.

2. The photo sensor array of claim 1, wherein the plurality of photodiodes is disposed on a single chip.

3. The photo sensor array of claim 1, wherein a final output is calculated based on a predetermined function form of outputs of photodiodes and predetermined mathematical coefficients.

4. The photo sensor array of claim 3, wherein the mathematical coefficients are selected to provide a spectral response curve of the photo sensor that approximates an ideal spectral response curve.

5. The photo sensor array of claim 1, wherein an output from the photo sensor is substantially constant throughout a wavelength range from 400 nm to 700 nm.

6. The photo sensor array of claim 5, wherein an error between the output from the photo sensor and an ideal spectral response is no more than about 18 percent.

7. The photo sensor array of claim 5, wherein an error between the output from the photo sensor and an ideal spectral response is no more than about 5 percent between about 450 nm to 700 nm.

8. A tuned photo sensor chip comprising:
   a plurality of photodiodes;
   a first portion of the plurality of photodiodes having a red filter;
   a second portion of the plurality of photodiodes having a green filter;
   a third portion of the plurality of photodiodes having a blue filter;
   a fourth portion of the plurality of photodiodes having no filter;
   a fifth portion of the plurality of photodiodes having spectral photo sensors; and
   a sixth portion of the plurality of photodiodes having temperature compensation sensors, wherein
   a final output is calculated based on a predetermined function form of outputs of photodiodes and predetermined mathematical coefficients, the mathematical coefficients selected to provide a spectral response curve of the photo sensor chip that approximates an ideal spectral response curve.

9. The tuned photo sensor chip of claim 8, wherein an output from the photo sensor chip is substantially constant throughout a wavelength range from 400 nm to 700 nm.

10. The tuned photo sensor chip of claim 8, wherein an error between the output from the photo sensor chip and the ideal spectral response is no more than about 18 percent.

11. The tuned photo sensor chip of claim 8, wherein an error between the output from the photo sensor chip and the ideal spectral response is no more than about 5 percent between about 450 nm to 700 nm.

12. A method for producing an output from a photo sensor that is desired throughout a predetermined wavelength range, comprising:
   combining a plurality of photodiodes into a chip, the plurality of photodiodes including a first portion having a red filter, a second portion having a green filter, a third portion having a blue filter, a fourth portion having no filter, a fifth portion of the plurality of photodiodes having spectral photo sensors, and a sixth portion of the plurality of photodiodes having temperature compensation sensors; and
   adjusting an output of each of the plurality of photodiodes a mathematical coefficient, the mathematical coefficients selected to provide a spectral response curve of the photo sensor that approximates an ideal spectral response curve.

13. The method of claim 12, wherein the predetermined wavelength range is from 400 nm to 700 nm.

14. The method of claim 12, further comprising selecting the mathematical coefficients to provide the spectral response curve of the photo sensor that has a spectral error between the output from the photo sensor and the ideal spectral response of no more than about 18 percent.

15. The method of claim 12, further comprising selecting the mathematical coefficients to provide the spectral response curve of the photo sensor that has a spectral error between the output from the photo sensor and the ideal spectral response of no more than about 5 percent from about 450 nm to 700 nm.

16. The method of claim 12, wherein the desired spectral response curve is further improved by spectral photo sensors having narrow band spectral responses.

* * * * *